United States Patent [19]

Sauer

[11] 4,069,460

[45] Jan. 17, 1978

[54] CURRENT COMPARATOR CIRCUIT

[75] Inventor: Don R. Sauer, San Jose, Calif.

[73] Assignee: National Semiconductor Corporation, Santa Clara, Calif.

[21] Appl. No.: 728,110

[22] Filed: Sept. 30, 1976

[51] Int. Cl.[2] .............................................. H03F 3/45

[52] U.S. Cl. .................................... 330/257; 307/262; 328/26

[58] Field of Search .................... 330/22, 30 D, 40, 69

[56] References Cited

U.S. PATENT DOCUMENTS 3,697,882 10/1972 Van de Plassche .................. 330/15

4,004,247 1/1977 Van de Plassche .............. 330/30 D

*Primary Examiner*—James B. Mullins

*Attorney, Agent, or Firm*—Gail W. Woodward; Willis E. Higgins

[57] ABSTRACT

Two currents that are to be compared are coupled to the two input terminals of a current mirror. The output is taken from a transistor stage which has its input coupled across the current mirror. In a balanced version the current mirror is made symmetrical and a balanced output pair is cross coupled across the current mirror, thus creating a fully symmetrical configuration.

5 Claims, 3 Drawing Figures

CURRENT COMPARATOR CIRCUIT

BACKGROUND OF THE INVENTION -

Prior art current comparators are typically complex. Ordinarily the currents to be compared are translated to voltages which are compared with the voltage differential operating a d-c amplifier to provide an output current. External power supplies must supply the output and complex amplifiers must be used to ensure accuracy.

SUMMARY OF THE INVENTION

It is an object of the invention to provide a simple accurate current comparator amenable to fabrication in IC form.

It is a further object of the invention to provide a current comparator wherein the energy for operation is obtained substantially entirely from the currents being compared so that the circuit is self-contained.

It is a feature of the invention that the current comparator having great dynamic range is easily fabricated in IC form.

These and other objects and features are achieved in simple circuit wherein a current mirror is coupled to the current sources in which the currents are to be compared. An output stage is cross coupled to the current mirror so that the output current represents the difference between the input currents. In a symmetrical version of the circuit, the current mirror is made symmetrical and the output stage consists of a pair of transistors cross coupled to the current mirror. The combined outputs of the pair are equal to the difference in currents. The current mirror can be made active by using a pair of emitter follower amplifiers to bootstrap the current reflection. In the case where the current mirror is made passive and diodes are used for coupling, the comparator circuit is operated solely by the currents being measured.

DESCRIPTION OF THE INVENTION

The invention relates to a circuit that performs the analog circuit function of subtraction. In effect, it compares two currents and has an output equal to their difference. The circuit is simple, sensitive, and accurate and lends itself to fabrication in integrated circuit (IC) form. In its preferred form the circuit comprises six matched transistors of like polarity interconnected in a simple selfactuated circuit. In a high sensitivity form an external power supply is used, but the current supplied is but a fraction of the currents being compared.

In the following discussion the transistor base current will be regarded as negligible. Since, in practice, base current will ordinarily be less than 1% of the collector current, this assumption is reasonable. While, in a rigorous solution the base currents would have to be considered, this is not ordinarily necessary nor is it necessary for an understanding of how the circuit functions.

Figure 1:
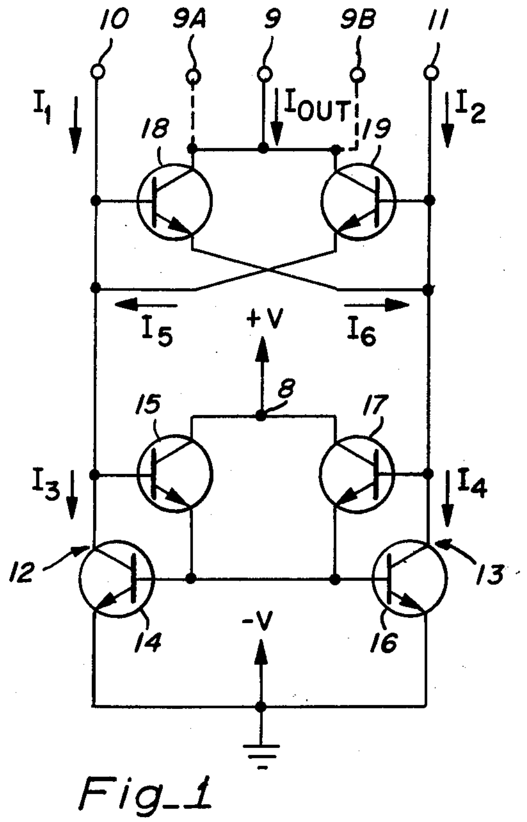
FIG. 1 is a schematic diagram of the circuit of the invention.

In the circuit of FIG. 1, a supply potential designated +V and −V is applied between terminals 8 and ground to operate transistors 15 and 17. The current drawn from this supply will be small compared to the larger of the input currents and hence can be ignored. The circuit relies on the currents supplied to input terminals 10 and 11 for operation.

$I_1$ and $I_2$ supplied to terminals 10 and 11 constitute the input currents to be compared. As will be shown hereinafter, $I_{OUT}$ at terminal 9 will be equal to the difference between $I_1$ and $I_2$.

For the first condition, it will be assumed that $I_1$ is present and $I_2$ is zero. Since $I_2$ is zero, transistor 19 will have no base current and will be off so that $I_5$ is zero. Thus $I_3$ at node 12 will be equal to $I_1$. Transistor 15 will be on and will pull the base of transistor 14 on. Thus node 12 will be at $2V_{BE}$. Since the bases of transistors 14 and 16 are in parallel, transistor 16 will be on to the same extent as transistor 14 so that $I_4$ at node 13 is equal to $I_3$ at node 12. Transistor 18 is on due to base current from $I_1$ so that $I_6$ is equal to $I_4$. Transistor 18 being on means that its emitter is one $V_{BE}$ below its base and this places node 13 at one $V_{BE}$. This means that transistor 17 is off. From the above, it can be seen that both transistors 17 and 19 will be off and that $I_{OUT}$ equals $I_1$.

In the second condition it will be assumed that $I_2$ is present and $I_1$ is zero. Zero $I_1$ means that transistor 18 is off and $I_6$ is zero. $I_2$ will turn transistor 19 on so that $I_5$ is equal to $I_3$. $I_4$, which equals $I_2$, will turn transistor 17 on and will flow in transistor 16. An equal current $I_3$ will flow in transistor 14. Node 13 will be at $2V_{BE}$ while node 12 will be at one $V_{BE}$. Thus transistors 18 and 15 will be off and $I_{OUT}$ will equal $I_2$.

In the third condition it will be assumed that $I_1$ and $I_2$ are present equally. Both transistors 15 and 17 will be on and nodes 12 and 13 will be at $2V_{BE}$. This means that both transistors 18 and 19 will be off, $I_5$ and $I_6$ will be zero, and $I_{OUT}$ will be zero. This condition will prevail only when $I_1$ is very close in magnitude to $I_2$.

For intermediate conditions where $I_1$ and $I_2$ are both present but of different magnitudes, the voltages at nodes 12 and 13 will adjust to set the conduction through either transistor 18 or transistor 19 to balance the circuit. If $I_1$ is larger than $I_2$, transistors 15 and 18 will be on, with transistor 15 adjusting the conduction in transistor 14 to equal $I_1$. The current mirror action produces the same flow in transistor 16 and the flow in transistor 16 and the voltage at node 13 will set the conduction in transistor 18 to equal the difference between $I_1$ and $I_2$. Here $I_6 = I_1 - I_2$. In this condition transitors 17 and 19 are both off.

In the intermediate condition where $I_2$ is greater than $I_1$, transistors 17 and 19 will be on and will operate as described above and transistors 15 and 18 will be off. It can be seen that the circuit has left-right symmetry. In terms of construction, it is desirable that this symmetry be achieved by using like devices. In discrete circuitry, matched transistor pairs are desired. In the IC version, which is preferred, it is desired that all transistors have the same dimensions and are fabricated in close proximity simultaneously. This means that all of the transistors will have matched characteristics.

In the special case where the comparator is to be used under the condition where one of the currents is always, the larger, symmetry is not necessary. In FIG. 1, if $I_1$ were always larger than $I_2$, transistors 17 and 19 could be omitted, thus reducing the circuit of the invention to its simplest form.

The circuit sensitivity is related to the smallest differential in current that can be sensed. For the case $I_1 = I_2$, the voltages at nodes 12 and 13 will be equal so that both transistors 18 and 19 will be off. The current differential needed to turn one of transistors 18 and 19 on is related to 1/Beta$^2$ (the reciprocal of the transistor current gain squared). This is due to the fact that the current mirror contains an emitter follower in cascade with a common emitter stage. For a nominal current gain of 100, the sensitivity is 10,000. This means that a current differential of 0.01% would be detected. Thus for sensitivity, high gain transistors are desirable. Also, in addition to operating on a small differential, the circuit is operative over a very large dynamic range.

Figure 2:
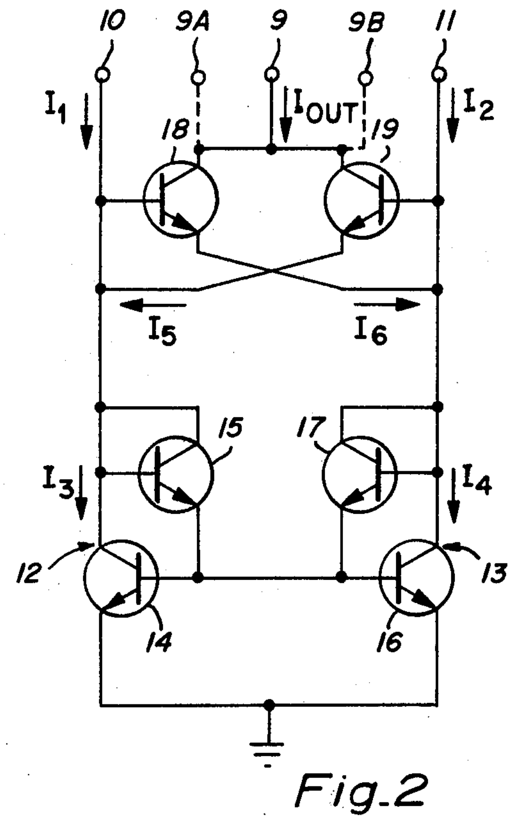
FIG. 2 is a schematic diagram of an alternative form of the circuit.

FIG. 2 shows an alternative form of comparator circuit that can be used in place of that of FIG. 1. The difference is in the current mirror. Transistors 15 and 17 are diode connected and therefore do not display current gain. The advantage is that no external power supply is needed and the circuit operates entirely from the $I_1$ and $I_2$ inputs. In this configuration the output $I_{OUT}$ will be zero for that input differential range of less than one part in Beta. For a Beta of 100 this is 1%. While the sensitivity is considerably poorer than that of FIG. 1, the circuit simplicity is attractive and useful. The circuit of FIG. 2 is preferred where the reduced sensitivity is tolerable.

As shown in dashed lines, the circuits of FIGS. 1 and 2 can have two outputs at terminals 9A and 9B. The collectors of transistors 18 and 19 can be uncoupled, thus providing two separate outputs, with $I_5$ flowing in the collector of transistor 19. The transistor 18 output at 9A performs the function of $I_1 - I_2$ but only when $I_1$ exceeds $I_2$. The transistor 19 output at 9B performs the function of $I_2 - I_1$ but only when $I_2$ exceeds $I_1$. The most common usage is as shown where the $I_{OUT}$ at terminal 9 is the absolute difference between $I_1$ and $I_2$.

Figure 3:
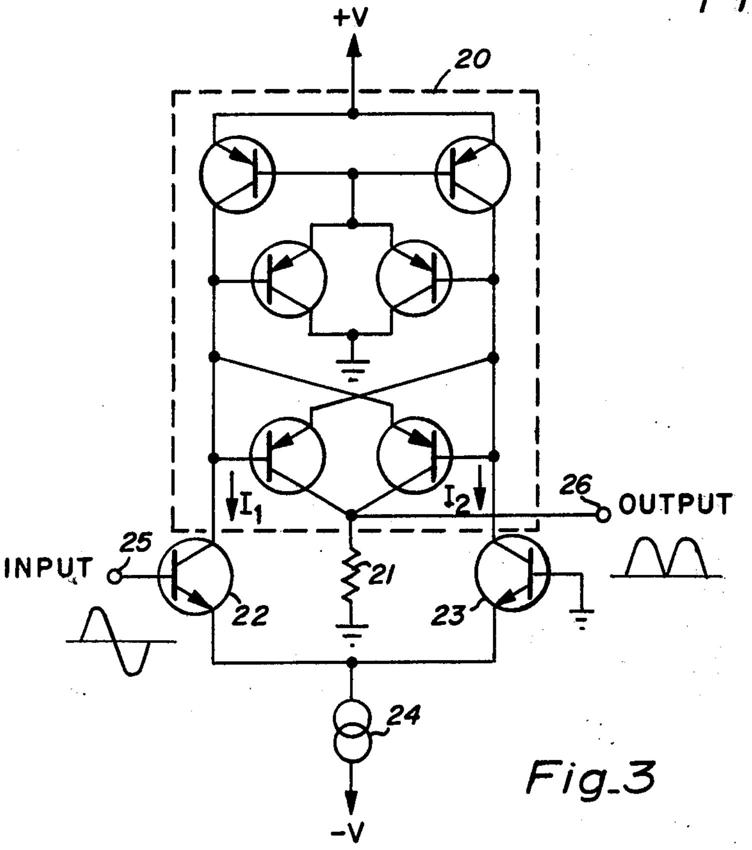
FIG. 3 is a schematic diagram of a precision full wave rectifier using the circuit of the invention.

FIG. 3 shows an application of the comparator of FIG. 1. The circuit performs precision full wave rectification of an alternating current input. The comparator 20 is shown inside a dashed outline. It is of the kind shown in FIG. 1 except that PNP transistors are used and the direction of current flow reversed. The output current, which is the difference between $I_1$ and $I_2$, flows in resistor 21. Transistors 22 and 23 are operated as a differential amplifier by way of current source 24. An a-c signal applied as input to terminal 25 will appear at output terminal 26 as the full wave rectified version. The maximum peak output voltage will be equal to the value of resistor 21 multiplied by the current flowing in source 24. When the input is operated so that the output peak voltage is below this value, the circuit will be linear and a high precision rectifier function accomplished.

My invention has been described and its character detailed. Clearly there are numerous alternatives and equivalents that could be employed within the spirit and intent of the invention. Accordingly, it is intended that the invention be limited only by the following claims.

I claim:

1. A symmetrical current comparator circuit for responding to the difference between first and second current sources, said sources having a common return point, said circuit comprising:

means for coupling first and second nodes of said circuit to said first and second current sources respectively;

current mirror means coupled between said first and second nodes and said common return point, said current mirror including a pair of transistors having their emitters coupled together and to said common return point, their bases coupled together, and their collectors coupled respectively to said first and second nodes, and level shifting means coupled from each of said collectors of said pair to said bases of said pair, said current mirror acting to force equality between the currents flowing in said first and second nodes; and first and second output transistors each having an emitter, a base, and a collector, the base of said first output transistor and the emitter of said second output transistor being coupled to said first node, the base of said second output transistor and the emitter of said first output transistor being coupled to said second node whereby the collectors of said output transistors constitute the output of said circuit.

2. The circuit of claim 1 whereon said output transistor collectors are coupled to provide separate outputs, the collector current of said first output transistor being equal to the current in said second source subtracted from the current in said first source but only when said first source current is larger and the collector current of said second output transistor being equal to the current in said second source but only when said first source current is larger.

3. The circuit of claim 1 wherein said output transistor collectors are coupled together to form a single circuit output in which the current flow is equal to the difference in current flowing in said first and second sources.

4. The circuit of claim 1 wherein said level shifting means comprise a pair of diodes coupled in forward biased configuration between said collectors and said bases of said pair of transistors.

5. The circuit of claim 1 wherein said level shifting means comprise a pair of emitter follower transistors, the emitters of said emitter follwers being coupled to said bases of pair of transistors, the bases of said emitter follower transistors being coupled respectively to the collectors of said pair of transistors; and means for coupling a source of supply potential between the collectors of said emitter follower transistors and said emitters of said emitters of said pair of transistors.

* * * * *